United States Patent [19]

Smith et al.

[11] Patent Number: 4,628,406
[45] Date of Patent: Dec. 9, 1986

[54] METHOD OF PACKAGING INTEGRATED CIRCUIT CHIPS, AND INTEGRATED CIRCUIT PACKAGE

[75] Inventors: Kenneth R. Smith, Aloha; Kent H. Johnston; George S. LaRue, both of Beaverton; Robert A. Mueller, Portland, all of Oreg.; Steven A. Tabor, Aptos, Calif.

[73] Assignee: Tektronix, Inc., Beaverton, Oreg.

[21] Appl. No.: 736,205

[22] Filed: May 20, 1985

[51] Int. Cl.$^4$ .............................................. H05K 1/11
[52] U.S. Cl. ..................................... 361/386; 29/832; 357/81; 361/414
[58] Field of Search ............... 361/386, 387, 388, 399, 361/400, 412, 414, 398; 29/832; 357/71, 81

[56] References Cited

FOREIGN PATENT DOCUMENTS 0166051 10/1982 Japan ..................................... 357/81

OTHER PUBLICATIONS

Dougherty, "Control of Thermal Coefficient of Expansion of Substrate Materials", IBM Tech. Disclosure Bulletin, vol. 19, No. 8, 1/77 p. 3048.
Johnson et al., "Multilayer Ceramic Fixed Layer Substrate Design", IBM Tech. Disclosure Bulletin, vol. 22, No. 5, 10/79, pp. 1841–1842.

Primary Examiner—A. D. Pellinen
Assistant Examiner—Morris Ginsburg
Attorney, Agent, or Firm—William S. Lovell; John D. Winkelman; John Smith-Hill

[57] ABSTRACT

An integrated circuit package comprises at least two integrated circuit chips each having a plurality of contact pads arranged in a first pattern on the interconnect face of the chip, and an elastic sheet-form interconnect member. The interconnect member has at least two main face areas, associated with the chips respectively, and comprises dielectric material and conductor runs supported by the dielectric material in mutually electrically insulated relationship and having termination points arranged in at least two second patterns at the main face areas respectively and corresponding with the first patterns respectively. The interconnect face of each is in confronting relationship with the associated main face area of the interconnect member, and the contact pads of the chip and the termination points of the associated main face area are in mutually registering relationship. A metallurgical bond is formed between each contact pad and the corresponding termination point. The assembly of the interconnect member and the integrated circuit chips is placed between, and in pressure contact with, first and second essentially rigid enclosure members, with the first enclosure member in thermally-conductive contact with the back face of at least one of the chips and being made of a material that has good thermal conductivity.

8 Claims, 3 Drawing Figures

METHOD OF PACKAGING INTEGRATED CIRCUIT CHIPS, AND INTEGRATED CIRCUIT PACKAGE

This invention relates to a method of packaging integrated circuit chips, and an integrated circuit package.

BACKGROUND OF THE INVENTION

It will be appreciated by those skilled in the art that in order to use an integrated circuit chip, it is necessary to make electrical connection to the integrated circuit incorporated within the chip. These connections are made through contact pads located at one main face (hereinafter called the interconnect face) of the chip. The contact pads are connected, e.g. using bond wires, to conductive strips of a substrate member. The package of the integrated circuit chip and the substrate is mounted on an etched circuit board (ECB), the conductive strips of the substrate member being connected at their distal ends to circuit runs of the ECB. In this manner, the integrated circuit is connected to other components mounted on the ECB.

It is frequently desired that several chips be mounted on a single substrate. However, when multiple chips are mounted on a common substrate, the need for re-work in the event that a chip proves defective may arise. Thus, if a device comprises several chips, one of which is defective, it may be desired to remove the defective chip and replace it with a good chip rather than scrap the entire device. However, removal of a defective chip and reattachment of a good chip is time consuming in the case of a device employing wire bonds, because each bond has to be broken and then reestablished.

The disadvantage of using wire bonding is avoided in the case of the "flip-chip" technique. By this method, the substrate, e.g. of ceramic material, carries conductive strips that terminate at the perimeter of the "footprint" of the chip in a pattern of connection points corresponding to the pattern of contact pads on the chip, and the chip is placed on the substrate with its interconnect face down and its contact pads in direct physical contact with the connection points. The bond pads or the connection points carry solder preforms, and by applying heat and pressure through the chip a direct metallurgical bond is established between the chip's contact pads and the substrate's connection points. However, the flip-chip technique is subject to the disadvantage that in the event of a mismatch between the coefficients of thermal expansion of the chip and of the substrate, the temperature range within which the packaged integrated circuit can be used without the reliability of the circuit being impaired owing to differential thermal expansion is quite small.

A third packaging method involves use of an epoxy adhesive to bond the chips to a substrate, which may be of essentially rigid ceramic material or it may be flexible. However, removal of a defective chip may cause damage to the substrate.

SUMMARY OF THE INVENTION

In a preferred embodiment of the present invention, at least two integrated circuit chips each having a plurality of contact pads arranged in a first pattern on the interconnect face of the chip are packaged, utilizing an elastic sheet-form interconnect member that has at least two main face areas, associated with the chips respectively, and comprises dielectric material and conductor runs supported by the dielectric material in mutually electrically-insulated relationship and having termination points arranged in at least two second patterns at the main face areas respectively and corresponding with the first patterns respectively. The interconnect face of each chip is placed in confronting relationship with the associated main face area of the interconnect member, and the contact pads of the chip and the termination points of the associated main face area are brought into mutually registering relationship, whereby electrically conductive contact is established between the contact pads and the termination points, and a metallurgical bond is formed between each contact pad and the corresponding termination point. The assembly of the interconnect member and the integrated circuit chips is placed between, and in pressure contact with, first and second essentially rigid enclosure members, with the first enclosure member in thermally-conductive contact with the back face of at least one of the chips and being made of a material that has good thermal conductivity.

By avoiding use of physical bonds between the chips and the rigid enclosure members, and by use of an elastic interconnect member, problems of differential thermal expansion are avoided. Moreover, since the bonds between the chips and the interconnect member are localized by virtue of their being contact pad-to-termination point bonds, the chips can be readily removed from the interconnect member, thus facilitating re-work.

Integrated circuit chips are conventionally made at the wafer level, each wafer comprising a hundred or more chips, and the wafer is sawn into its separate chips which are then individually packaged. For some applications, e.g. that require a large amount of computational power, it has been proposed that the wafer not be sawn into separate chips but that after fabrication of the wafer, interconnections be made among the chips and that the entire wafer be packaged and used as a single unit. The chips remain functionally distinct during fabrication, and the wafer includes redundant chips, because it is not possible to predict which chips of the wafer might ultimately prove defective and it is not desirable that an entire wafer be scrapped because one chip is defective. This proposal, known as wafer scale integration, is attractive for some purposes, but is subject to certain disadvantages. In particular, because each wafer of a given batch could, at least in theory, use a unique set of chips, the routing of interconnections among the chips represents a complex problem, and the possibly different relative locations of chips on different wafers may cause timing problems.

By use of the present invention, many of the advantages of wafer scale integration can be obtained and many of the disadvantages avoided. The advantages are obtainable because the present invention does not require use of high temperatures in attaching the chips to the interconnect member, and therefore the chips can be placed close together, and the above-mentioned disadvantages can be avoided because there is no need to accommodate the possibility of defective chips.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
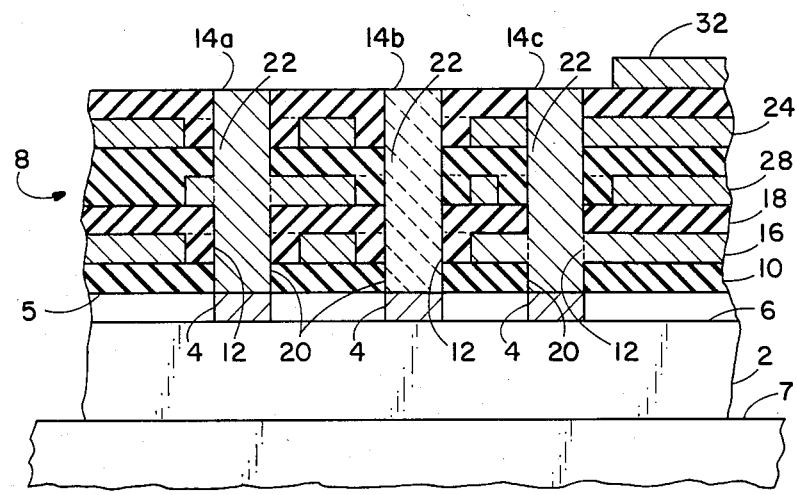
FIG. 1 is a partial cross-sectional view showing an IC chip and an interconnect circuit therefor.

FIG. 1 shows an integrated circuit chip 2 having contact pad 4 formed on an interconnect face 6 of the chip. Although only three contact pads are shown in FIG. 1, in a practical implementation of the invention there might be as many as 200 pads distributed over the interconnect face of the IC chip. The lower main face of the chip is in good thermally-conductive contact with a heat sink 7, e.g. of aluminum.

Extending over the chip 2 is a thin-film flexible circuit 8. The circuit 8 comprises multiple layers of flexible dielectric material, such as polyimide, and several runs of conductive material that are insulated from each other by the dielectric material. The flexible circuit can be manufactured in known manner. For example, a first layer 10 of polyimide may be deposited by spraying onto a sheet of teflon PTFE or other material to which the polyimide does not adhere. Openings 12 that are 25 $\mu$m or more in diameter are formed in the layer 10 at locations at which vias 14 (conductive links passing through the dielectric layers) are required, for example using photolithographic techniques. A layer 16 of metal is evaporated onto the layer of polyimide and patterned in accordance with the desired layout of the conductor run, for example by photolithographic and selective etching techniques. If it is desired that the conductor run should contact the metal of a particular via (the via 14c in the case of run 16), the metal layer is patterned so that metal is not removed from close to the perimeter of the particular opening in the first layer, whereas if it is desired that the conductor run should not contact the metal of a particular via (the vias 14a and 14b), the layer is patterned so that all metal within a predetermined distance from the perimeter of the opening is removed. A second layer 18 of polyimide is sprayed over the remaining metal and the exposed polyimide of the first layer, and so on. When all the desired layers of polyimide and metal have been built up, the via openings are filled with metal 22, for example by electroplating. Thus, a good electrical contact is established between the metal of the via and the metal of the conductor runs that extend to the perimeter of the via openings. The end of the via that is exposed at the lower face 5 of the flexible circuit constitutes a termination point for the conductor run that is connected to the via.

The pattern of termination solder points corresponds to the pattern of contact pads 4 on the IC chip 2. By this is meant that when the flexible circuit is placed with its bottom layer 10 of polyimide confronting the interconnect face of the chip, the termination points register with the contact pads 4. It will therefore be appreciated that when viewing the bottom layer 10 of polyimide, the pattern of termination points is the mirror image of the pattern of contact pads 4.

The polyimide material is partially transparent. By using no more than about four layers of polyimide, each layer being about 1 mil thick, the flexible circuit 8 is rendered sufficiently transparent to visible light to enable the contact pads 4 to be seen through the flexible circuit. In order to connect the flexible circuit to the chip 2, the chip is placed on the stage of a microscope with its interconnect face up and the flexible circuit, with its face 5 down, is placed over the chip. The relative positions of the chip and the flexible circuit are adjusted until the pattern of termination points is in register with the pattern of contact pads, and a clamp is then lowered onto the flexible circuit in order to hold it in position. A heated welding tool is then placed on top of each via, pressure is applied to the heated tool, and a thermocompression weld between the via and the contact pad results. Instead of using thermocompression welding, the flexible circuit may be connected to the chip by thermosonic welding, in which case the connections are made sequentially, or by soldering, using solder preforms attached to the vias 14. It is not necessary that each of the conductor layers of the flexible circuit constitute a signal path. In a preferred embodiment of the invention, as shown in FIG. 1, the layers 16 and 24 are ground planes and are therefore interconnected by the vias, such as the via 14c, used to provide a ground connection to the IC. The layer 28 contains signal runs each having a uniform characteristic impedance, which can be achieved owing to the presence of the ground planes 16 and 24. The layer 28 may also contain power supply lines. The layer 32 is a microstripling signal run, i.e. a signal run having a uniform width equal to twice the thickness of the layer of polyimide between the layer 32 and the ground plane 24 and having a substantially uniform characteristic impedance, or it may be of undefined geometry and non-uniform characteristic impedance.

The different conductor layers are patterned so as to insure that the flexible circuit is transparent. Thus, the ground planes are not continuous, over the whole area of the flexible circuit, but are in narrow strips in the region of the vias 14, although they might be essentially continuous in areas that are distant from the vias. A given signal or power supply layer may be patterned to form two or more discrete conductor runs connected to different vias, and a given run may be connected to more than one via in the event that the IC requires an external interconnection between selected parts thereof.

Instead of aligning the connection points of the flexible circuit visually to the pads 4, alignment marks defining the desired positions of the corners of the chip could be printed on the face 5 of the flexible circuit and the chip could be aligned with the circuit 8 by reference to these marks. The circuit 8 would be placed on the stage of a microscope with the face 5 upwards, and the chip 2 would be placed on top of the flex circuit with the face 6 downwards. The corners of the chip would be brought into alignment with the alignment marks. Using a heated collet, the chip may be heated and the pads 4 secured to the connection points 20 by soldering. This technique allows use of a flexible circuit having additional layers, since it is not necessary that the circuit be transparent. In such case the flexible circuit could include, above the layer 24, power supply lines that are not of uniform characteristic impedance but, owing to the ground plane 24, nevertheless have a very small uncompensated impedance, e.g. less than 40 pH.

Figure 2:
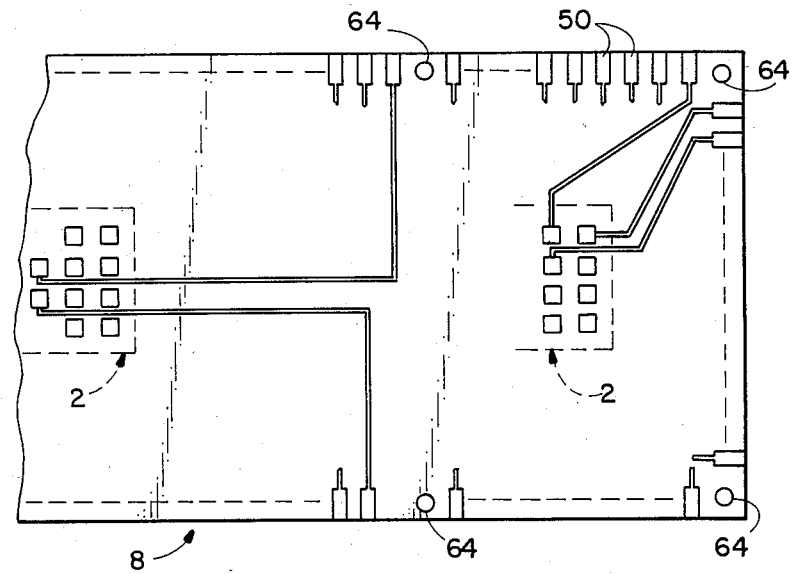
FIG. 2 is a plan view of the interconnect circuit.

As indicated by FIG. 2, the flexible circuit 8 defines multiple patterns of termination points for connection to the pads of respective integrated circuit chips. Exemplary collections of such termination points are shown in FIG. 2 partially surrounded by dashed lines which represent the locations at which integrated circuits 2 are to be placed. The flexible circuit is connected to the several chips sequentially, and the metallurgical bonds between the contact pads and the termination points insure that manipulation of the flexible circuit to obtain registration between a pattern of termination points of the flexible circuit and a pattern of contact pads of a chip does not disturb connections that have previously been established between the flexible circuit and other chips.

Figure 3:
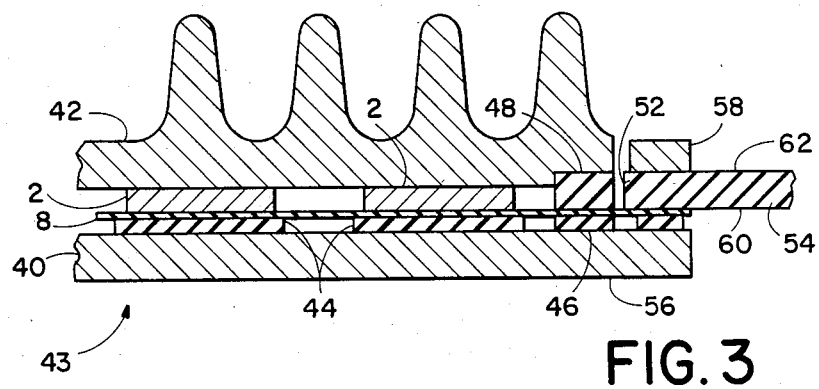
FIG. 3 is an enlarged sectional view of an IC package mounted to a circuit board.

The assembly of the flexible circuit 8 and the IC chips 2 attached thereto is mounted between a pair of aluminum plates 40 and 42 to form a complete IC package 43. As shown in FIG. 3, the back face of each chip is in direct contact with the plate 42, which constitutes a heat sink, whereas elastomer pressure pads 44 are interposed between the flex circuit 8 and the plate 40. Two frames 46 and 48 of B-stage epoxy adhesive are used to secure the plates 40 and 42 to the flex circuit 8 and to provide environmental protection for the chips and the flex circuit.

In addition to the termination points of vias 14a, 14b and 14c, the flex circuit also has at its periphery contact pads 50 (FIG. 2) which are exposed at the face 5 of the flex circuit. The contact pads 50 are positioned to register with contact pads (not shown) distributed about the periphery of an opening 52 in an etched circuit board 54. As further shown in FIG. 3, plate 40 has a flange portion 56 that extends beyond the periphery of the plate 42 and is used for securing the package 43 to the board 54. Plate 42 of the package 43 is presented towards the opening from one side 60 of the board 54 and is inserted into the opening, the plate 40 remaining at the side 60 with its flange portion 56 overlapping the board. A frame 58 is positioned around the opening at the opposite side 62 of the board. The board, the flex circuit, the plate 40 and the frame 58 have all been preformed with holes (shown at 64 in FIG. 2 for the flex circuit 8) for receiving bolts (not shown) and the bolts are inserted through the holes and thereby secure the package 43 to the board 54. A pressure pad 64 between the portion 56 of the plate 40 and the flex circuit provides contact force to maintain pressure contact between the contact pads of the flex circuit and the contact pads of the board 54. The pressure pads 44 provide contact force to maintain good thermally conductive contact between the chips 2 and the plate 42. In the preferred embodiment of the invention, it is not necessary to isolate the bulk material of the chips 2 electrically from the plate 42, and therefore there is no need for any dielectric material between the chips and the plate 42. If, however, isolation of the bulk material of the chips were necessary, a thin layer of dielectric material could be provided between the chips and the plate 42 and the thermal resistance would still be sufficiently small for most purposes.

It will be appreciated that the invention is not restricted to the particular methods and packages that have been described with reference to the drawings, since variations may be made therein without departing from the scope of the invention as defined in the appended claims. For example, although the flexible circuit is built up by spraying layers of polyimide, it would be possible to laminate layers of flexible dielectric material together to form the flexible circuit. Since this might entail using thicker layers of dielectric than can be obtained by spraying, it might be necessary to use a material that is more transparent than polyimide for the dielectric in order for the flexible circuit to be sufficiently transparent to permit alignment by viewing through the flexible circuit. Although the invention finds particular application when applied to integrated circuit chips having their contact pads at the interior of the interconnect face, the invention is also applicable to chips having their contact pads at the perimeter only of the interconnect face. The plate 40 is described as being of aluminum and as serving no interconnect purpose. However, the plate 40 may itself be a ceramic substrate that incorporates conductor runs and has electrical components attached thereto, e.g. by surface mounting.

We claim:

1. A method of packaging at least two integrated circuit chips each having an interconnect face and a back face and also having a plurality of contact pads arranged in one or more first patterns on its interconnect face, the methed comprising providing an elastic sheet-form interconnect member that has at least two main face areas and comprises dielectric material and conductor runs supported by said dielectric material in mutually electrically-insulated relationship and having termination points arranged in at least two second patterns at said main face areas respectively and corresponding with said first patterns respectively, placing said interconnect face of each chip in mutually confronting relationship with the main face area at which is arranged the pattern of termination points that corresponds with the pattern of contact pads of the chip, bringing the pattern of contact pads of the chip and the corresponding pattern of termination points of the interconnect member into mutually registering relationship, so as to form an assembly of the interconnect member and the integrated circuit chips wherein electrically conductive contact is established between said pads and said termination points, and forming a metallurgical bond between each contact pad and the corresponding termination point of the interconnect member.

2. A method according to claim 1, further comprising placing the assembly of the interconnect member and the integrated circuit chips between, and in pressure contact with, first and second essentially rigid enclosure members, said first enclosure member being in thermally-conductive contact with the back of at least one of the chips and being made of a material that has good thermal conductivity.

3. A method according to claim 1, wherein said bond is formed by soldering.

4. A method according to claim 1, wherein said bond is formed by welding.

5. An integrated circuit package comprising at least two integrated circuit chips each having a back face and a plurality of contact pads arranged in one or more first patterns on an interconnect face of the chip, and an elastic sheet-form interconnect member that has at least two main face areas and comprises dielectric material and conductor runs supported by said dielectric material in mutually electrically-insulated relationship and having termination points arranged in at least two second patterns at said main face areas respectively and corresponding with said first patterns respectively, the interconnect face of each chip being in mutually confronting relationship with the main face area at which is arranged the pattern of termination points that corresponds with the pattern of contact pads of the chip, the pattern of contact pads of the chip being in mutually registering relationship with the corresponding pattern of termination points of the interconnect member so as to form an assembly of the interconnect member and the integrated circuit chips, and each contact pad being metallurgically bonded to the corresponding termination point of the interconnect member.

6. A package according to claim 5, wherein said interconnect member has a multi-layer structure, comprising a plurality of layer-form runs of conductive material separated by layers of dielectric material.

7. A package according to claim 5, further comprising first and second essentially rigid enclosure members between which the assembly of the interconnect member and the integrated circuit chips is located, the first enclosure member being in thermally-conductive contact with the back face of at least one of the chips and being made of a material that has good thermal conductivity.

8. A package according to claim 7, wherein all the main face areas of the interconnect member are at the same side of the interconnect member, and the package comprises resilient means interposed between the interconnect member and the second enclosure member for maintaining pressure contact between the back faces of the chips and the first enclosure member.

* * * * *